US009651981B2

(12) United States Patent
Lindholm et al.

(10) Patent No.: US 9,651,981 B2
(45) Date of Patent: May 16, 2017

(54) INTEGRATED CHIP WITH HEATING ELEMENT AND REFERENCE CIRCUIT

(75) Inventors: Christian Lindholm, Villach (AT); Henrik Hassander, Villach (AT)

(73) Assignee: Infineon Technologies Austria AG, Villach (AT)

( * ) Notice: Subject to any disclaimer, the term of this patent is extended or adjusted under 35 U.S.C. 154(b) by 894 days.

(21) Appl. No.: 13/570,630

(22) Filed: Aug. 9, 2012

(65) Prior Publication Data

US 2014/0043052 A1    Feb. 13, 2014

(51) Int. Cl.
| | | |
|---|---|---|
| *G01R 31/00* | (2006.01) | |
| *G05F 3/30* | (2006.01) | |
| *H01L 23/34* | (2006.01) | |
| *G05F 3/00* | (2006.01) | |
| *G05F 1/00* | (2006.01) | |
| *G01K 1/00* | (2006.01) | |

(52) U.S. Cl.
CPC .............. *G05F 3/30* (2013.01); *H01L 23/345* (2013.01); *G01K 1/00* (2013.01); *G05F 1/00* (2013.01); *G05F 3/00* (2013.01); *H01L 2924/0002* (2013.01)

(58) Field of Classification Search
CPC .............. G01K 1/001; G01K 2003/00; G01K 2201/00; G01K 2203/00; G05F 1/00; G05F 3/00; G05F 7/00
USPC ..................................................... 324/750.03
See application file for complete search history.

(56) References Cited

U.S. PATENT DOCUMENTS

| | | | |
|---|---|---|---|
| 5,608,333 A * | 3/1997 | Hayashi | ........................ 324/711 |
| 5,956,350 A | 9/1999 | Irrinki et al. | |
| 6,973,402 B1* | 12/2005 | Lin | ................................ 702/108 |
| 7,463,089 B1* | 12/2008 | Bapat | ...................... H03F 3/217 330/10 |
| 7,728,575 B1 | 6/2010 | Ozalevli et al. | |
| 8,044,677 B2 | 10/2011 | Cremonesi et al. | |
| 8,358,145 B1* | 1/2013 | Ferris et al. | ............. 324/750.03 |
| 8,791,683 B1 | 7/2014 | Porter et al. | |
| 9,172,237 B2* | 10/2015 | Sato | ..................... H01L 27/1225 |
| 2002/0133789 A1 | 9/2002 | Hsu et al. | |
| 2002/0162829 A1* | 11/2002 | Weber et al. | ................. 219/209 |
| 2004/0104724 A1* | 6/2004 | Sato | ............................. 324/224 |
| 2005/0030149 A1* | 2/2005 | Adkisson | ............ H01L 27/0802 338/23 |
| 2006/0044047 A1* | 3/2006 | Porter | .................... G01K 7/015 327/512 |

(Continued)

OTHER PUBLICATIONS

Phang, K., et al., "Low Voltage, Low Power CMOS Bandgap References", ECE 1352 University of Toledo, Nov. 21, 2001, p. 1-17.

(Continued)

*Primary Examiner* — Jermele M Hollington
*Assistant Examiner* — Temilade Rhodes-Vivour
(74) *Attorney, Agent, or Firm* — Eschweiler & Potashnik, LLC (57) ABSTRACT

Some aspects of the present disclosure relate to an apparatus that includes an integrated chip having a bandgap reference circuit and one or more heating elements. The bandgap reference circuit is located within a subset of the integrated chip and outputs a reference voltage having a temperature dependence. The one or more of the heating elements vary the temperature of the subset of the integrated chip.

15 Claims, 5 Drawing Sheets

(56) References Cited

U.S. PATENT DOCUMENTS

| | | | |
|---|---|---|---|
| 2007/0018655 A1* | 1/2007 | Ausserlechner et al. | 324/501 |
| 2007/0138414 A1* | 6/2007 | Stevens et al. | 250/504 R |
| 2007/0145547 A1* | 6/2007 | McKerreghan | H01L 23/3107 257/676 |
| 2007/0176617 A1 | 8/2007 | Kuwana et al. | |
| 2008/0017971 A1* | 1/2008 | Hollis | H01L 23/5386 257/698 |
| 2008/0188994 A1* | 8/2008 | Singh | F04D 27/004 700/300 |
| 2008/0205017 A1* | 8/2008 | Nellissen | B01L 3/502707 361/796 |
| 2008/0303547 A1* | 12/2008 | Balasubramanian et al. | 326/38 |
| 2010/0167959 A1 | 7/2010 | Johnson et al. | |
| 2010/0280788 A1* | 11/2010 | Bohan | F24F 11/001 702/130 |
| 2010/0301332 A1 | 12/2010 | Dibra et al. | |
| 2011/0121292 A1* | 5/2011 | Saether | H01L 23/345 257/48 |
| 2011/0273186 A1 | 11/2011 | Karnad et al. | |

OTHER PUBLICATIONS

"Introduction to Bandgap Reference Generators", Texas A&M University, 607 (ESS), Feb. 5, 2009, p. 1-18.

M. Mobarak, et al., "Bandgap Reference: Basics", ECEN 607 (ESS) Texas A&M University, Feb. 10, 2005, p. 1-27.

Walt Jung, "Getting the Most from IC Voltage References", Analog Dialogue 28-1 (1994), p. 13-21.

Hans Camenzind, "Designing Analog Chips", www.designinganalogchips.com, Feb. 2005, p. 1-242.

* cited by examiner

INTEGRATED CHIP WITH HEATING ELEMENT AND REFERENCE CIRCUIT

BACKGROUND

Bandgap reference circuits are voltage reference circuits that are configured to generate a substantially constant reference voltage independent of temperature, and that are widely used in many integrated circuits such as analog-to-digital and digital-to-analog converters. Bandgap reference circuits generate a temperature independent reference voltage ($V_{ref}$) by maintaining an internal voltage source that has a positive temperature coefficient ($c_1$) and another internal voltage source that has a negative temperature coefficient ($c_2$). By summing the outputs of the positive and negative internal voltage sources (i.e., $V_{ref}=c_1V_1+c_2V_2$) the temperature dependence of the bandgap reference circuit can be cancelled, resulting in a substantially constant reference voltage ($V_{ref}$) over a range of temperatures.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 1:
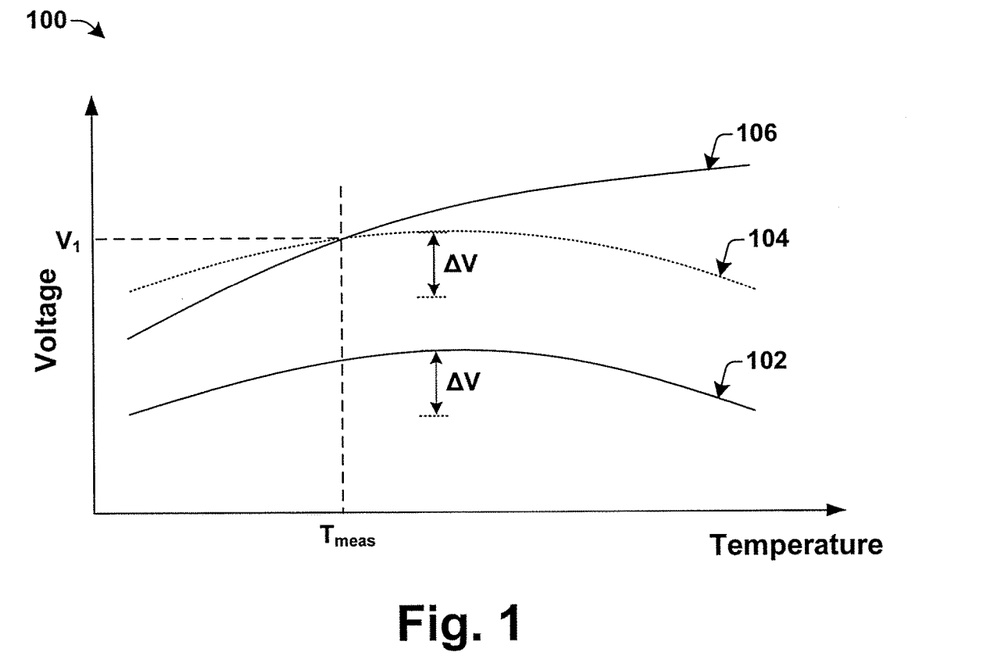
FIG. 1 illustrates a graph showing reference voltages as a function of temperature for different bandgap reference circuits.

While bandgap reference circuits are configured to output a substantially constant reference voltage independent of temperature, bandgap reference circuits do have a temperature dependence. For example, FIG. 1 illustrates a graph 100 showing a temperature dependence of a bandgap reference circuit. Trend line 102 illustrates a reference voltage produced by a bandgap reference circuit made by a process without processing variations (e.g., without CD variation, misalignment, etc.). Trend line 102 has a temperature dependence with a bow shape that varies within an acceptable variation range $\Delta V$. Badly centered processes can increase the temperature variation of a reference voltage. For example, trend line 106 illustrates a reference voltage produced by a bandgap reference circuit made by a process having processing variations. The trend line 106 has a slope that varies by a value that is not within an acceptable variation range $\Delta V$.

Production tests can be done after an integrated chip is fabricated to ensure that a bandgap reference circuit has a temperature dependence that is within an acceptable variation range $\Delta V$. To properly account for processing variations, such production tests must measure the reference voltage at more than one temperature since measurement of the reference voltage at a single temperature cannot differentiate between trend lines having different slopes. For example, measurement of a voltage $V_1$ at a temperature $T_{meas}$ can either correspond to trend line 104, which varies within an acceptable variation range $\Delta V$, or trend line 106, which does not vary within an acceptable variation range $\Delta V$. However, to measure a reference voltage at more than one temperature increases the production time of an integrated chip (IC). For ICs having a low profit margin, cost prohibits testing at more than one temperature, since testing takes too much time. Therefore, in such ICs often the slope of a voltage reference circuit cannot be tested to ensure proper performance.

Accordingly, the present disclosure provides for a method and apparatus for expedient testing of a bandgap reference circuit over a range of temperatures. In some embodiments, the apparatus comprises an integrated chip having a bandgap reference circuit and one or more heating elements. The bandgap reference circuit is configured to output a reference voltage having a value that is temperature dependent. The one or more heating elements are configured to receive a control signal from a control element. Upon receiving the control signal, the one or more heating elements are configured to produce heat that varies the temperature of a subset of the integrated chip comprising the reference voltage circuit over a temperature range, without substantially affecting a temperature of other portions of the integrated chip. By using heating elements to vary the temperature of a subset of the integrated chip, the subset can be heated quickly, thereby allowing the bandgap reference circuit to be tested over a plurality of temperatures.

Figure 2:
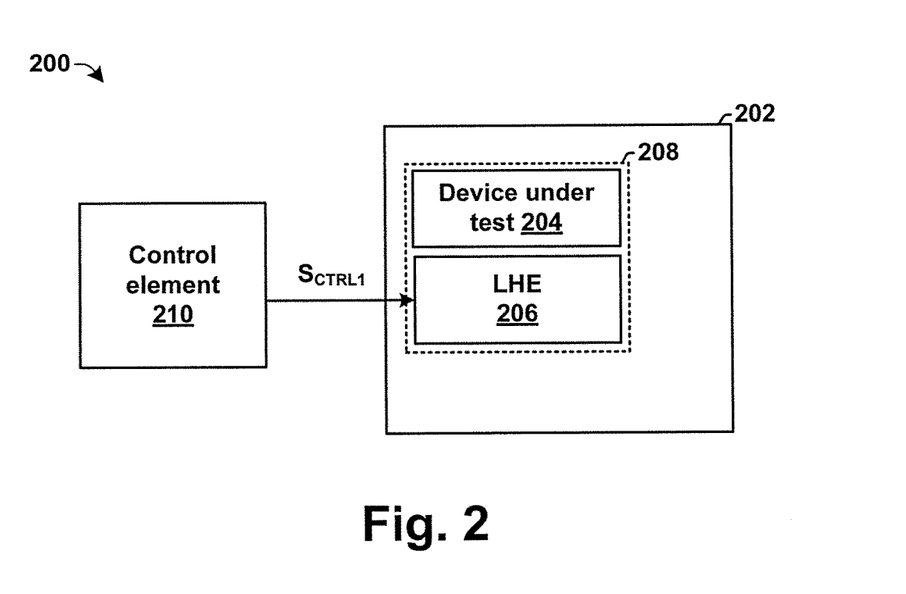
FIG. 2 illustrates a block diagram of some embodiments of an integrated chip having a bandgap reference circuit and one or more on-chip, heating elements.

FIG. 2 illustrates a block diagram 200 of some embodiments of an integrated chip 202 having a device under test 204 and one or more on-chip, heating elements 206.

The device under test 204 comprises one more semiconductor devices located within a subset 208 of the integrated chip 202. The device under test 204 has a temperature dependence, such that operation of the device under test 204 will vary as a function of the temperature. For example, in some embodiments, the device under test 204 comprises a bandgap reference circuit configured to generate a reference voltage. In such an embodiment, as the temperature of the subset 208 rises, the value of the reference voltage output from the bandgap reference circuit will change. In other embodiments, the device under test 204 may comprise other types of circuits, such as other reference voltage circuits, for example.

The one or more on-chip, heating elements 206 are configured to receive a first control signal $S_{CTRL1}$ from a control element 210 in communication with the heating elements 206. In various embodiments, the control element 210 may comprise a current source, a voltage source, or a supply voltage. The control element 210 may comprise an on-chip control element or an off-chip control element.

In response to the first control signal $S_{CTRL1}$, the heating elements 206 are configured to generate heat within the subset 208 in a controlled, predefined manner. In some embodiments, the generated heat discretely varies a temperature of the subset 208 in a step-wise manner that raises the temperature of the subset 208 in a manner that provides for a plurality of distinct, discrete temperatures over a temperature range. For example, in some embodiments, at a first time the heating elements 206 are configured to receive a first control signal $S_{CTRL1}$ having a first value that is chosen to raise the subset 208 to a first temperature and at a second time the heating elements 206 are configured to receive a first control signal $S_{CTRL1}$ having a second value that is chosen to raise the subset 208 to a second temperature.

In some embodiments, the plurality of discrete temperatures comprise two discrete temperatures. For example, the plurality of discrete temperatures may comprise a room temperature/tester environment temperature and a second elevated temperature produced by the heating elements 206. In other embodiments, the plurality of discrete temperatures comprise three or more discrete temperatures. For example, the plurality of discrete temperatures may comprise a room temperature/tester environment temperature and two or more elevated temperatures produced by the heating elements 206.

In some embodiments, the first control signal comprises a current. As the current passes through one or more heating elements 206, the heating elements 206 dissipate a heat that is proportional to the square of the current multiplied by the electrical resistance of the heating elements 206. The dissipated heat increases the temperature of the subset 208 and the device under test 204 without substantially affecting areas of the integrated chip 202 outside of the subset 208. In some embodiments, the heating elements 206 are positioned within the subset 208 of the integrated chip, thereby placing the heating elements 206 in close proximity to the device under test 204.

The heating elements 206 may comprise a wide range of components, which have a resistance. For example, in various embodiments, the heating elements 206 may comprise a resistor, a metal wire, a transistor, a PN junction, or more complex logic elements such as a regulator, an amplifier, etc., for example. In some embodiments, the heating elements 206 comprise existing circuit elements present in the device under test 204. By utilizing existing circuit elements present within the device under test 204, the heating elements 206 can control a temperature within the subset 208 without consuming additional area of the integrated chip 202.

In some embodiments, the heating elements 206 comprise existing dummy devices (e.g., dummy transistors, resistors, etc.) within the device under test 204. Dummy devices are devices that do not contribute to the functionality of the device under test 204, but rather have been added to the device under test 204 to improve lithography process margins (in contrast to active devices, which do contribute to the functionality of the device under test 204). For example, the dummy devices allow for lithographic exposures to form a pattern having a regular layout that optimizes pattern density, reduces variability, and improves manufacturing parameters.

Figure 3:
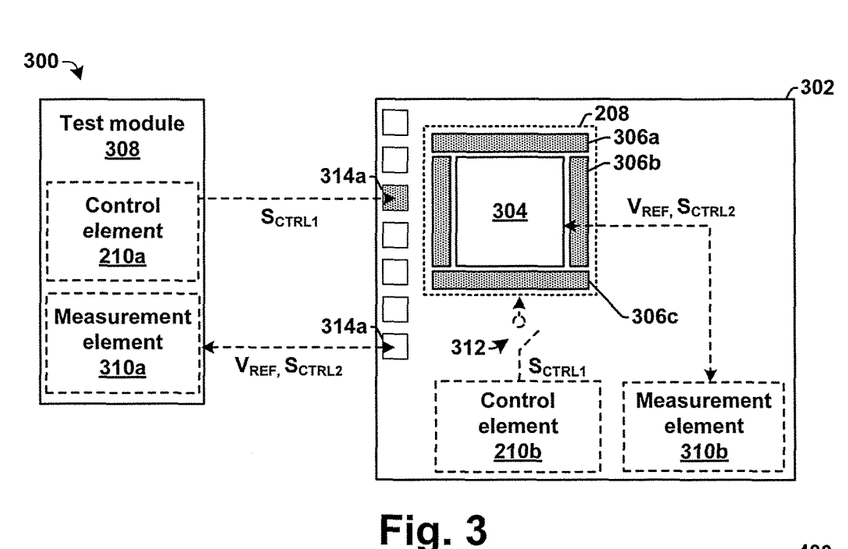
FIG. 3 illustrates a block diagram of some alternative embodiments of an integrated chip comprising a bandgap reference circuit and heating elements.

FIG. 3 illustrates a block diagram 300 of some embodiments of an integrated chip 302 having a bandgap reference circuit 304 and a plurality of on-chip, heating elements 306. The bandgap reference circuit 304 is configured to output a reference voltage $V_{REF}$ having a temperature dependence (i.e., a $V_{REF}$ that varies as the temperature of the bandgap reference circuit 304 changes).

The heating elements 306 are located in close proximity to the bandgap reference circuit 304 (i.e., within a proximity that allows for the heating elements to increase the temperature of the bandgap reference circuit 304). In some embodiments, the heating elements 306 are configured to surround the bandgap reference circuit 304 so that heating elements 306 collectively operate to increase the temperature of the bandgap reference circuit 304 without substantially increasing the temperature of surrounding areas of the integrated chip 302. In other embodiments, the heating elements 306 are intermixed with (e.g., located between) elements of the bandgap reference circuit 304.

The heating elements 306 are configured to receive a first control signal $S_{CTRL1}$ from a control element 210, which causes the heating elements 306 to generate a heat that is transferred to the bandgap reference circuit 304. In some embodiments, wherein the first control signal $S_{CTRL1}$ comprises a current, the heating elements 306 dissipate a heat that is proportional to the square of a current value of the first control signal $S_{CTRL1}$. In other embodiments, wherein the first control signal $S_{CTRL1}$ comprises a voltage, the heating elements 306 dissipate a heat that is proportional to the voltage value of the first control signal $S_{CTRL1}$. Since the heating elements 306 increase the temperature of a subset 208 of the integrated chip 302 without substantially increasing the temperature of the remainder of the integrated chip 302, the temperature of the bandgap reference circuit 304 can be quickly increased (e.g., over microseconds), thereby allowing for a plurality of discrete temperatures (e.g., two temperatures, three temperatures, etc.) to be achieved in a short time.

In various embodiments, the control element 210 may comprise an off-chip control element 210a or an on-chip control element 210b. In some embodiments, the off-chip control element 210a is comprised within an off-chip test module 308 configured to perform testing on the bandgap reference circuit 304. In some embodiments, the on-chip and off-chip control elements, 210a and 210b, are selectively connected to the heating elements 306 by way of one or more switching elements 312. In other embodiments, the off-chip control elements, 210a are connected to the heating elements 306 by way of one or more dedicated I/O pads 314. For example, in some embodiments, a first I/O pad 314a connects the test module 308 to the heating elements 306 and is configured to provide the first control signal $S_{CRTL1}$ to the one or more heating elements 306.

In some embodiments, a measurement element 310 is configured to measure the reference voltage $V_{REF}$ output from the bandgap reference circuit 304. The measurement element 310 may comprise an off-chip measurement element 310a or an on-chip measurement element 310b. In some embodiments, the off-chip measurement element 310a is comprised within the off-chip test module 308. In such embodiments, the test module 308 may be in communication with the integrated chip 302 by way of the one or more I/O pads 314. For example, in some embodiments, a second I/O pad 314b connects the bandgap reference circuit 304 to the off-chip measurement element 310a and is configured to convey a reference voltage to the measurement element 310.

During operation, the measurement element 310 is configured to measure the reference voltage $V_{REF}$ at a plurality of discrete temperatures over a temperature range. For example, in some embodiments the measurement element 310 is configured to perform a first measurement of the reference voltage $V_{REF}$ at a first temperature. After the first measurement, the control element 210 is configured to adjust a control signal $S_{CTRL1}$ that is provided to the heating elements 306, heating up the temperature of the bandgap reference circuit 304 and causing the reference voltage $V_{REF}$ to move according to a slope defined by a temperature coefficient. The measurement element 310 then measures the reference voltage $V_{REF}$ at a second temperature.

In some embodiments, the temperature of the subset 208 may be increased in a step-wise manner over a plurality of discrete temperatures by incrementally increasing the current provided to the heating elements. In other embodiments, the temperature of the subset 208 may alternatively or additionally be increased in a step-wise manner over a plurality of discrete temperatures by increasing the number of activated heating elements 306. For example, by activating a first heating element 306a, the bandgap reference circuit 304 can be raised to a first temperature. By additionally activating a second heating element 306b, the bandgap reference circuit 304 can be raised to a second temperature, which is greater than the first temperature.

By measuring the reference voltage $V_{REF}$ over varying temperatures, the measurement element 310 can determine a temperature coefficient of the bandgap reference circuit 304 (i.e., a variation of the reference voltage $V_{REF}$ as a function of temperature). In some embodiments, based upon the determined temperature coefficient, the measurement element 310 can generate a second control signal $S_{CRTL2}$, which is provided to the bandgap reference circuit 304. The second control signal $S_{CRTL2}$ operates to trim one or more elements within the bandgap reference circuit 304 so as to reduce the temperature coefficient. As provided herein "trimming" may refer to a broad range of trimming operations. For example, trimming may refer to changes made to a reference voltage circuit to get a same DC voltage at a given temp or trimming may refer to changes made to a reference voltage circuit to reduce slope of reference voltage.

It will be appreciated that the illustrated subset 208 is a non-limiting example of a local area that can be heated by the one or more heating elements 306. The subset 208 is intended to illustrate the localization of heating by the heating elements 306, and in other embodiments, the subset 208 may comprise varying sizes and or shapes.

Figure 4:
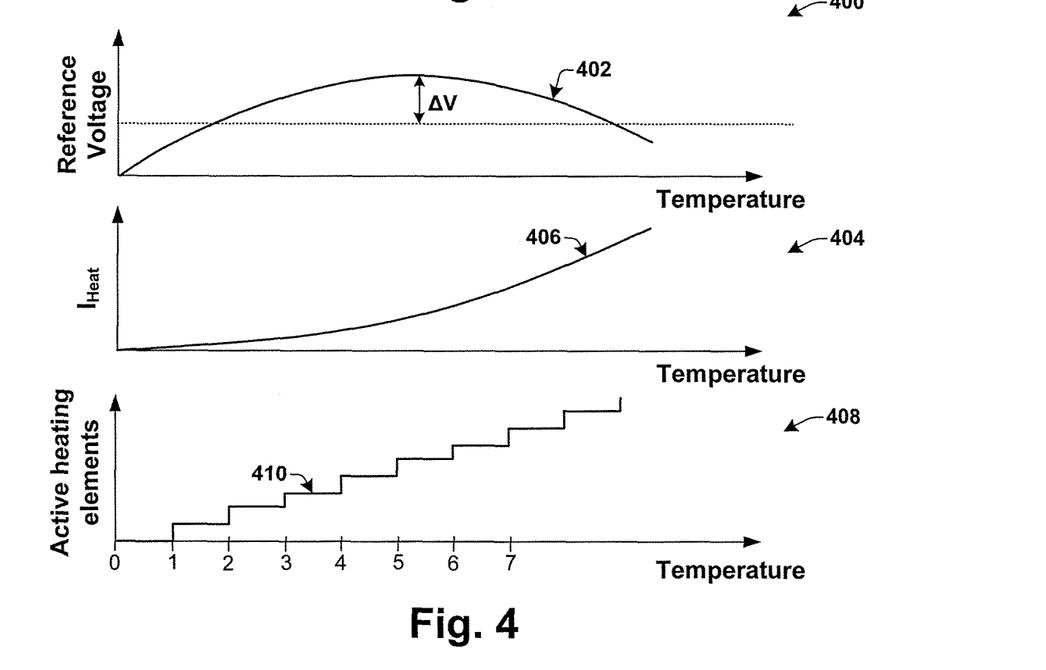
FIG. 4 illustrates graphs showing relationships between reference voltage, temperature, and a number of active heating elements.

FIG. 4 illustrates graphs (400, 404, 408) showing relationships between reference voltage, temperature, and a number of active heating elements.

Graph 400 illustrates a trend line 402 showing a relationship between a reference voltage (y-axis) output by a bandgap reference circuit and temperature (x-axis). As shown by trend line 402, as the temperature increases the reference voltage output from a bandgap reference circuit follows a bow shape that increases and then decreases. It will be appreciated that the bow shape of trend line 402 may vary due to processing variations in the process used to form the integrated chip comprising the bandgap reference circuit.

Graph 404 illustrates a trend line 406 showing a relationship between a temperature of a bandgap reference circuit (x-axis) and a current passed through a heating element (y-axis). As shown by trend line 406, as the current provided through heating elements increases the temperature of the bandgap reference circuit increases. This is because the power dissipated by a heating element is equal to the resistance of the heating element multiplied by the current squared (i.e., $P=I^2R$). Therefore, by increasing the current driven through the heating element, the heat dissipated by the heating element also increases.

It will be appreciated that a current value that is applied to achieve a given temperature may vary depending on a type of heating element. For example, if a heating element comprises a resistor, a given temperature may be achieved using a current having a first value. However, if the heating element comprises a PN junction, the given temperature may be achieved using a current having a second value greater than the first value. This is because the PN junction has a lower resistance and therefore will produce less heat when a current is passed through it. Accordingly, to produce a same temperature, a larger current must be passed through a heating element comprising a low resistance (e.g., a PN junction) than through a heating element comprising a high resistance (e.g., a resistor).

Graph 408 illustrates a trend line 410 showing a relationship between a temperature of a bandgap reference circuit (x-axis) and a number of active heating elements (y-axis). As shown by trend line 410, as the number of active heating elements increases (e.g., as a number of heating elements receiving a separate current increases), the temperature of the bandgap reference circuit increases. This is because the total heat generated by the heating elements is equal to the sum of the heat generated by individual heating elements.

In consideration of graphs 404 and 408, it will be appreciated that in various embodiments the disclosed heating elements may increase the temperature of a device under test (e.g., a bandgap reference circuit) by a number of various ways. For example, in some embodiments, the temperature may be increased by increasing the current passed through a heating element, by increasing the number of activated heating elements receiving a current, or by a combination thereof. One of ordinary skill in the art will also appreciate that the ways of increasing the temperature are not limited to those of graphs 404 and 408. For example, in other embodiments, the temperature may be increased by increasing the voltage passed through a heating element, by increasing the number of activated heating elements receiving a voltage, or by a combination thereof.

Figure 5:
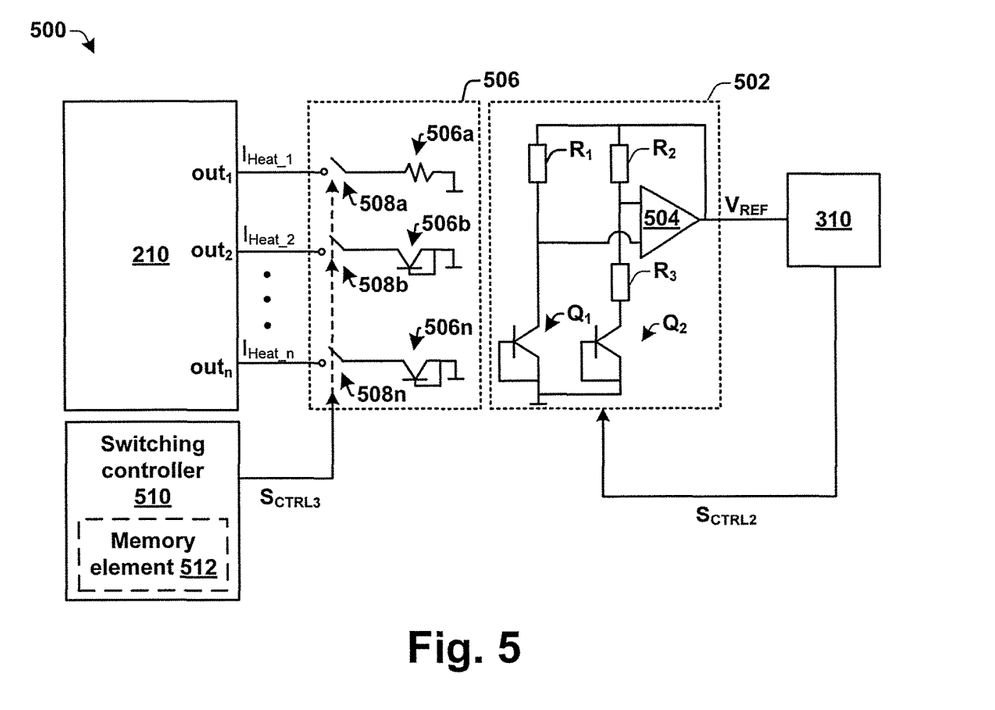
FIG. 5 illustrates a schematic diagram of some embodiments of a reference voltage testing circuit comprising a bandgap reference circuit and heating elements.

FIG. 5 illustrates a schematic diagram of a reference voltage testing circuit 500 having a bandgap reference circuit 502 and a plurality of heating elements 506. It will be appreciated that the bandgap reference circuit 502 illustrated in FIG. 5 is a non-limiting example of a reference circuit that may be tested using the disclosed plurality of heating elements 506. In other embodiments, the disclosed plurality of heating elements 506 may be used to raise the temperature of reference circuits having different circuit architectures.

The bandgap reference circuit 502 comprises a first path having a first resistor $R_1$ in series with a first transistor $Q_1$ comprising a diode connected unit transistor. The bandgap reference circuit 502 further comprises a second path having a second resistor $R_2$ in series with a third resistor $R_3$ and with a second transistor $Q_2$ comprising n diode connected unit transistors connected in parallel. The base-emitter voltage $V_{BE}$ for each transistor $Q_1$ and $Q_2$ has a negative temperature coefficient (i.e., it decreases as temperature increases). However, the difference between the base-emitter voltages $V_{BE}$ of the first and second transistors $Q_1$ and $Q_2$ has a positive temperature coefficient (i.e., it increases as temperature increases).

The first and second resistors, $R_1$ and $R_2$, are connected in parallel to the output of an operational amplifier 504. The resistors, $R_1$ and $R_2$, and feedback voltage from the operational amplifier 504 provide for equal currents to the bases of transistors $Q_1$ and $Q_2$, which have different emitter areas. By forcing $V_1$ to be equal to $V_2$, the voltage drop on $R_3$ is equal to the difference of the $V_{BE}$ of the transistors $Q_1$ and $Q_2$. Therefore, the reference voltage $V_{REF}$ output from the operational amplifier 504 is the sum of the base-emitter voltage difference and one of the base-emitter voltages. Therefore, the resulting reference voltage $V_{REF}$ output from the bandgap reference circuit 502 is substantially constant.

The heating elements 506 comprise a plurality of heating elements 506a-506n in communication with a control element 210. In various embodiments the heating elements 506 may comprise a dummy transistor (e.g., 506b; used to improve lithographic processing parameters of transistors $Q_1$ and/or $Q_2$), a dummy resistor (e.g., 506a; used to improve lithographic processing parameters of resistors $R_1$, $R_2$, and/or $R_3$), and/or other dummy devices.

In some embodiments, the heating elements 506 are respectively connected to the control element 210 by way of one or more switching elements 508a-508n. For example, in some embodiments a first heating element 506a is connected to the control element 210 by way of a first switching element 508a, while a second heating element 506b is connected to the control element 210 by way of a second switching element 508b, etc. In some embodiments, the one or more switching elements 508 are configured to selectively connect the heating elements 506 to the control element 210 during testing, and to disconnect the heating elements 506 from the control element 210 when testing is not being done.

In some embodiments, the control element 210 comprises a plurality of output nodes $out_1, \ldots, out_n$ respectively configured to provide the heating elements 506 with separate heating currents $I_{Heat\_1}, \ldots, I_{Heat\_n}$ (i.e., heating currents that are independent of the other heating currents). By providing separate heating currents to the heating elements 506, the temperature of the bandgap reference circuit 502 can be increased when a switching element 508 is closed. In contrast, for a control element 210 having a single output node configured to provide a single heating current, the heat produced by heating elements 506 would drop when an additional heating element 506 is activated, since the current passing through parallel resistors is inversely proportional to the number of parallel resistors.

In some embodiments, the switching elements 508 comprise on-chip switches (e.g., CMOS devices). In other embodiments, the switching elements 508 comprise mechanical switches located external to the integrated chip. The number of switching elements 508 is proportional to the temperature sensitivity. For example, one switching element 508 can provides for two different temperatures within the bandgap reference circuit 502 (e.g., a first temperature when the switch is open, a second temperature when the switch is closed), two switching elements 508 can provide for at least three temperatures the bandgap reference circuit 502, etc.

During testing, a switching controller 510 is configured to generate a third control signal $S_{CRTL3}$ that operates the switching elements 508 to selectively activate one or more of the heating elements 506. When a heating element 506 is activated, it produces heat (e.g., a current flows from the control element 210 through the activated heating element 506). The temperature of the bandgap reference circuit 502 varies as the switching controller 510 operates the switching elements 508. In some embodiments, the switching controller 510 is an off-chip switching controller comprised within an external test module. In other embodiments, the switching controller 510 is an on-chip switching controller comprised within the integrated chip 500.

In some embodiments, the switching controller 510 comprises a memory element 512 configured to store data (e.g., an algorithm) corresponding to a predetermined sequence of how the switching elements 508 are to be operated. In such an embodiments, the switching controller 510 is configured to access the memory element 512 and to operate the plurality of switching elements 508 according to the predetermined sequence, so as to cause the temperature of the bandgap reference circuit 502 to incrementally increase in a step-wise manner over a predetermined temperature range (e.g., spanning a range of between approximately 100° C. to approximately 200° C.). Selectively operating the switching elements 508 to increase the temperature of the bandgap reference circuit 502 allows for a measurement element 310 to measure the reference voltage $V_{REF}$ output from the bandgap reference circuit 502 over a range of temperatures.

In some embodiments, the measurement element 310 is configured to determine a temperature coefficient of the bandgap reference circuit 502 (i.e., to determine a variation of the reference voltage $V_{REF}$ as a function of temperature) from a plurality of reference voltages $V_{REF}$ measured over a temperature range. Based upon the determined temperature coefficient, the measurement element 310 can generate a second control signal $S_{CTRL2}$, which operates to trim one or more elements within the bandgap reference circuit 502 to reduce the temperature coefficient of the bandgap reference circuit 502.

Figure 6:
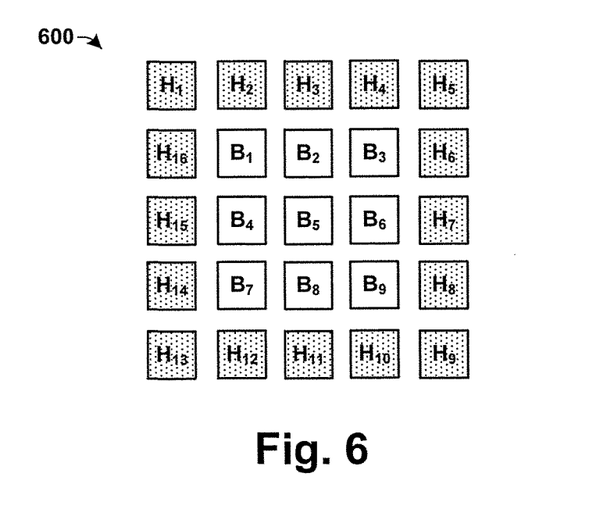
FIG. 6 illustrates a block diagram of some embodiments of an exemplary layout of a voltage reference circuit and heating elements.

In some embodiments, the measurement element 310 is configured to reduce the temperature coefficient by trimming one or more of the resistors in the bandgap reference circuit 502 (e.g., resistors $R_1$, $R_2$, and/or $R_3$). In other embodiments, the measurement element is configured to reduce the temperature coefficient by varying the ratio of transistors $Q_1$ and $Q_2$. For example, FIG. 6 illustrates a block diagram of an embodiment of bandgap reference circuit 600 corresponding to integrated chip 500.

The bandgap reference circuit 600 is illustrated as a plurality of squares. Squares labeled with a B represent transistors of the bandgap reference circuit and squares labeled with an H represent dummy devices of the bandgap reference circuit. In particular, the bandgap reference circuit comprises nine bandgap reference circuit transistors B and sixteen dummy transistors H. Transistor $B_1$ corresponds to a first bipolar transistor $Q_1$, while transistors $B_2$-$B_9$ correspond to a second bipolar transistor a $Q_2$.

The dummy transistors H are positioned around the bandgap reference circuit transistors B. The dummy transistors H are configured to produce a heat within bandgap reference circuit transistors B over a temperature range. For example, by providing a current to dummy transistors $H_1$, $H_3$, $H_5$, $H_7$, $H_9$, $H_{11}$, $H_{13}$, and $H_{15}$ during a first time, a first temperature is achieved, while by providing a current to dummy transistors $H_1$-$H_{16}$ during a second time a second temperature is achieved. From the first and second temperatures, a temperature coefficient can be determined. If the temperature coefficient is greater than an acceptable value, one or more of transistors $B_2$-$B_9$ can be deactivated to adjust a ratio between $Q_1$ and $Q_2$, and accordingly the temperature coefficient.

It will be appreciated that the control element of the disclosed integrated chip may be implemented in a variety of different ways. FIGS. 7A-7D illustrate schematic diagram various embodiments of integrated chips having various implementations of control elements.

Figure 7A:
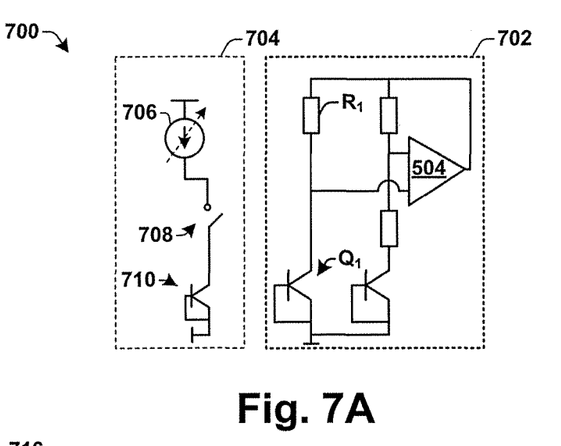
FIGS. 7A-7D illustrate schematic diagrams showing various embodiments of an integrated chip having various implementations of control elements.

FIG. 7A illustrates an integrated chip 700 having a device under test 702 and a testing unit 704. The testing unit 704 has a control element comprising current source 706 that is external to the device under test 702. The current source 706 is connected to a heating element 710 by way of a switch 708 and is configured to apply a current to the heating element 710. The applied current causes heat to be generated by the heating element 710, as described above. In various embodiments, the current source 706 may comprise a variable or fixed current source.

Figure 7B:
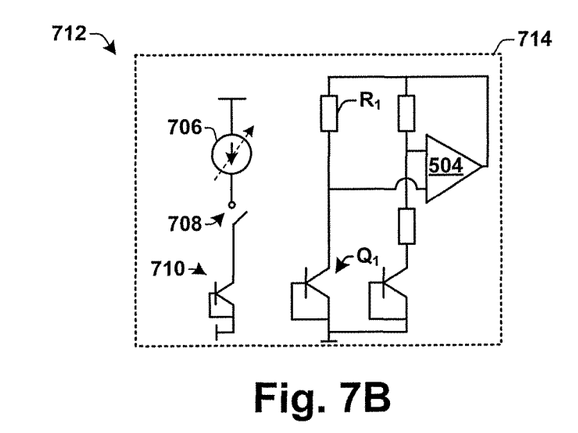

FIG. 7B illustrates an integrated chip 712 having a device under test 714. In integrated chip 712, the current source 706 is internal to the device under test (e.g., a current source utilized by the DUT), so that the current source 706 is configured to apply a current to the heating element 710 internally from the device under test 714. Such an internal current source 706 allows for testing to be done without an external test module.

Figure 7C:
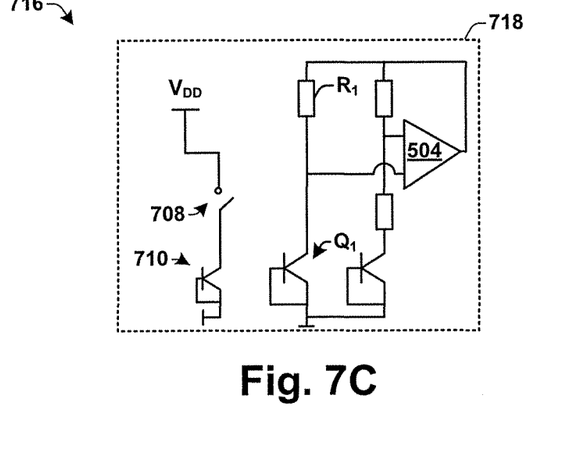

FIG. 7C illustrates an integrated chip 716 having a device under test 718. The device under test 718 comprises a control element comprising an on-chip supply voltage $V_{DD}$. The on-chip supply voltage $V_{DD}$ is connected to a heating element 710 by way of a switch 708 and is configured to apply a voltage to the heating elements internally from the device under test 718. The applied voltage causes heat to be generated by the heating element 710, as described above.

Figure 7D:
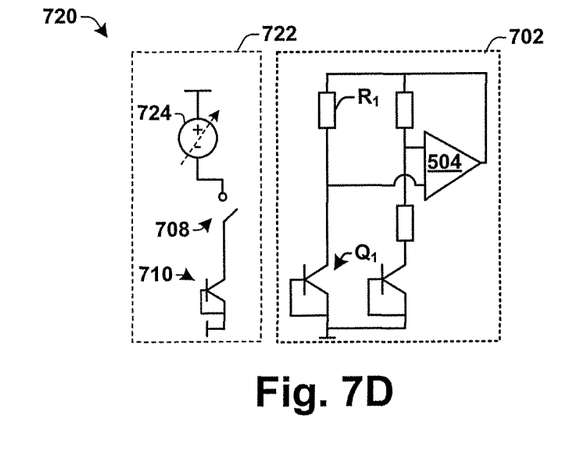

FIG. 7D illustrates an integrated chip 720 having a device under test 702 and a testing unit 722. The testing unit 722 has a control element comprising a voltage source 724 that is external to the device under test 702. The voltage source 724 is connected to a heating element 710 by way of a switch 708 and is configured to apply a voltage to the heating element 710. In various embodiments, the voltage source 724 may comprise a variable or fixed voltage source. In alternative embodiments, the voltage source 724 may be comprised within the device under test 702 so that the voltage source 724 is configured to apply a voltage to the heating element 710 internally from the device under test 702.

Figure 8:
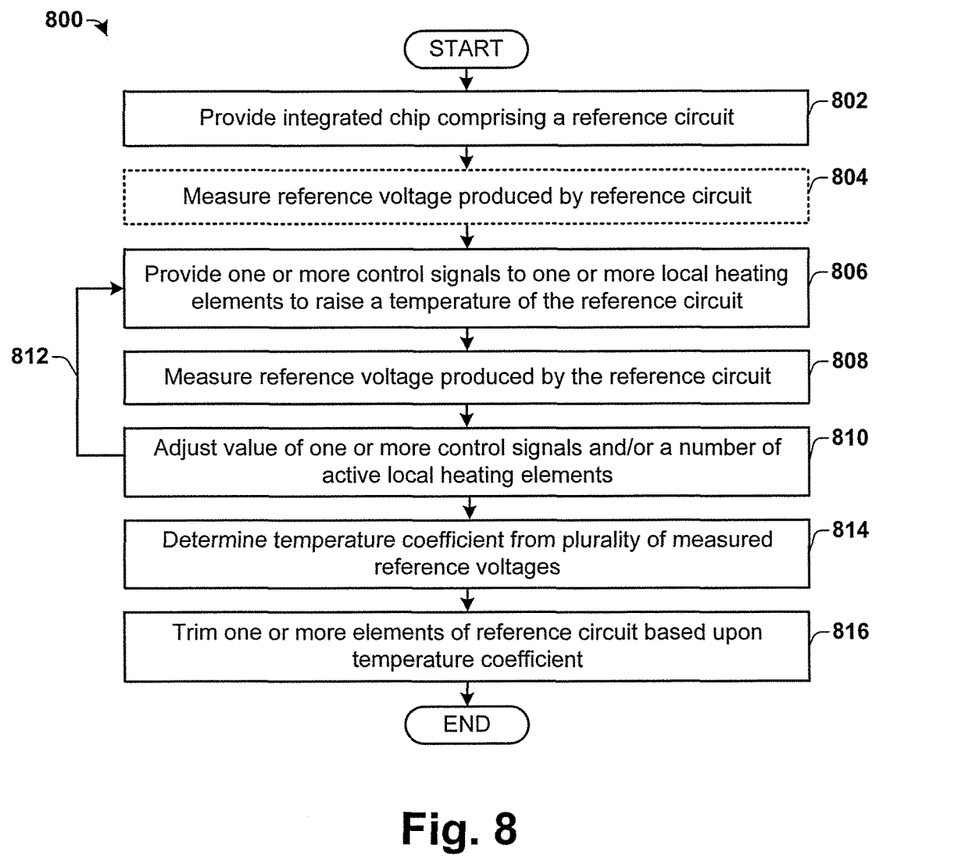
FIG. 8 is a flow diagram of some embodiments of a method for determining temperature coefficients for a bandgap reference circuit using on-chip, heating elements.

FIG. 8 is a flow diagram of some embodiments of a method 800 for determining temperature coefficients for a reference circuit using on-chip, heating elements.

While the disclosed method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 802 an integrated chip comprising a reference circuit is provided. The reference circuit is configured to generate a reference voltage having a value that depends upon a temperature of the reference circuit. In some embodiments, the reference circuit may comprise a bandgap reference circuit.

In some embodiments, a reference voltage produced by the reference circuit is measured, at 804. In such an embodiment, the reference voltage corresponds to a reference voltage produced by the reference circuit at room temperature or at a tester environment temperature (i.e., a reference voltage measured before heating elements raise the temperature of the reference circuit).

At 806, one or more control signals are provided to one or more heating elements. The one or more control signal cause the heating elements to generate heat, which raises a temperature of the reference circuit.

At 808, a reference voltage produced by the reference circuit is measured at the temperature.

At 810, a value of the control signal and/or a number of active heating elements is adjusted. Adjusting a value of the control signal (e.g., a current value) and/or the number of active heating elements adjusts the temperature of the reference circuit.

At 812, acts 806-810 are repeated iteratively to increase a temperature of the reference voltage circuit in a step-wise manner. Increasing the temperature of a reference voltage provides for a plurality of reference voltage values over a temperature range comprising a plurality of discrete temperatures (e.g., two discrete temperatures, three discrete temperatures, etc.). For example, during a first iteration, a control signal having a first current value is provided to one or more heating elements to raise the temperature of the reference circuit to a first temperature and a first reference voltage is measured. During a second iteration, a control signal having a second current value is provided to one or more heating elements to raise the temperature of the reference circuit to a second temperature and a second reference voltage is measured.

At 814, a temperature coefficient is determined from the plurality of measured reference voltages. In particular, the slope of the plurality of reference voltages over a range of temperatures, can be used to determine a temperature coefficient of the reference circuit (i.e., since the temperature coefficient is proportional to the first derivative of reference voltage and temperature).

At 816, one or more elements of the reference circuit are trimmed based upon the determined temperature coefficient. In various embodiments, trimming one or more elements of the reference circuit may comprise changing the resistance of one or more resistors within the reference circuit or changing a ratio between transistors of a reference circuit to affect the reference voltage output from the reference circuit.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An integrated chip, comprising:
    a bandgap reference circuit comprised within a subset of an integrated chip, adjacent to a second section of the integrated chip, and configured to output a reference voltage having a temperature dependence;
    one or more heating elements comprised within the integrated chip and configured to vary a temperature of the subset by a first amount and to vary a temperature of the second section of the integrated chip by a second amount less than the first amount, wherein the one or more heating elements are configured to vary the temperature of the subset over a temperature range in a step-wise manner that provides for a plurality of discrete temperatures;

wherein the one or more heating elements are configured to be coupled to a control element configured to iteratively provide one or more control signals to the one or more heating elements, measure the reference voltage produced by the bandgap reference circuit, and adjust a value of the one or more control signals, so as to measure a plurality of reference voltages at a plurality of step-wise increasing temperature, wherein the control signals vary the temperature of the subset based upon a current value of the control signals or a number of heating elements being driven by the control signals;

one or more switching elements coupled between the control element and the one or more heating elements and configured to selectively couple the control element to the one or more heating elements; and a switching controller that is separate from the control element and configured to generate a third control signal that selectively operates the one or more switching elements to connect the control element to the one or more heating elements, wherein upon connecting the control element to the one or more heating elements the one or more heating elements produce heat.

2. The integrated chip of claim 1, wherein the one or more heating elements comprise dummy devices configured to improve lithographic processing parameters for one or more elements within the integrated chip.

3. The integrated chip of claim 1, further comprising:
a memory element configured to store data corresponding to a predetermined sequence of operation for the one or more switching elements,
wherein the switching controller is configured to operate the one or more switching elements according to the predetermined sequence to adjust a value of the control signals so as to achieve a plurality of discrete temperatures in the subset.

4. The integrated chip of claim 1, wherein the control element comprises an on-chip current source configured to output a selected current value to the one or more heating elements.

5. The integrated chip of claim 1, wherein the heating elements are positioned to surround the bandgap reference circuit.

6. The integrated chip of claim 1, further comprising:
a measurement element configured to ascertain the plurality of reference voltages by measuring a reference voltage output from the bandgap reference circuit at a plurality of discrete temperatures over a temperature range and to determine a temperature coefficient of the bandgap reference circuit from the plurality of reference voltages.

7. The integrated chip of claim 6, wherein the measurement element is further configured to generate a second control signal that operates to trim one or more elements within the bandgap reference circuit to reduce a variation of the temperature coefficient.

8. The integrated chip of claim 1, further comprising:
the control element configured to iteratively provide the one or more control signals to the one or more heating elements, measure the reference voltage produced by the bandgap reference circuit, and adjust the value of the one or more control signals, so as to measure the plurality of reference voltages at the plurality of step-wise increasing temperatures.

9. A testing circuit, comprising:
a device under test comprised within a subset of an integrated chip, adjacent to a second section of the integrated chip, and having a temperature dependence, such that operation of the device under test is configured to vary as a function of temperature, wherein the device under test comprises a bandgap reference circuit configured to output a reference voltage having a value that is temperature dependent;

one or more dummy devices comprising dummy transistors comprised within the integrated chip and configured to produce heat to vary a temperature of the device under test by a first amount and to vary a temperature of the second section of the integrated chip by a second amount less than the first amount; and a measurement element configured to:
ascertain a plurality of reference voltages by measuring a reference voltage output from the bandgap reference circuit at a plurality of discrete temperatures over a temperature range;
determine a temperature coefficient of the bandgap reference circuit from the plurality of reference voltages; and
perform trimming of one or more elements within the bandgap reference circuit based on the temperature coefficient.

10. The testing circuit of claim 9, further comprising:
a control element configured to generate a control signal and to provide the control signal to the one or more dummy devices, wherein the one or more dummy devices are configured to produce heat responsive to the control signal;
one or more switching elements coupled between the control element and the one or more dummy devices; and
a switching controller configured to selectively operate the one or more switching elements to connect the control element to the one or more dummy devices, wherein upon connecting the control element to the one or more dummy devices, the one or more dummy devices produce heat.

11. The testing circuit of claim 10,
wherein the control element comprises a current source having a plurality of output nodes;
wherein respective output nodes are configured to generate a control signal having a current value that is independent of a current value of control signals that are output from other output nodes.

12. The testing circuit of claim 9, wherein the one or more dummy devices are configured to improve lithographic processing parameters for one or more elements within the integrated chip.

13. A method of determining a temperature coefficient for a reference circuit, comprising:
providing an integrated chip comprising a reference circuit configured to output a reference voltage having a temperature dependence and a second section of the integrated chip adjacent to the reference circuit;
providing one or more control signals to one or more heating elements comprised within the integrated chip, wherein upon receiving a control signal the one or more heating elements are configured to produce heat that raises a temperature of the reference circuit by a first amount and that raises a temperature of the second section of the integrated chip by a second amount less than the first amount;

iteratively providing the one or more control signals to the one or more heating elements, measuring a corresponding reference voltage produced by the reference circuit, and adjusting a value of the one or more control signals, so as to measure a plurality of reference voltages at a plurality of step-wise increasing temperatures;

adjusting a value of at least one of the one or more control signals to generate a plurality of discrete temperatures for the reference circuit;

measuring reference voltages produced by reference circuit at the plurality of discrete temperatures to generate a plurality of measured reference voltages;

determining a temperature coefficient from the plurality of measured reference voltages; and trimming one or more elements of the reference circuit to minimize a variation of the temperature coefficient at the plurality of discrete temperatures.

14. The method of claim 13, wherein the heating elements comprise dummy devices configured to improve lithographic processing parameters for one or more elements within the integrated chip.

15. The method of claim 13, wherein the one or more heating elements are configured to vary the temperature of the reference circuit over a temperature range in a step-wise manner that provides for a plurality of discrete temperatures.

* * * * *